(12) United States Patent
Xu et al.

(10) Patent No.: US 7,545,188 B1
(45) Date of Patent: Jun. 9, 2009

(54) MULTIPHASE CLOCK GENERATOR

(75) Inventors: Chao Xu, Suwanee, GA (US); Al Xuefeng Fang, Suwanee, GA (US)

(73) Assignee: Integrated Device Technology, Inc, San Jose, CA (US)

( * ) Notice: Subject to any disclaimer, the term of this patent is extended or adjusted under 35 U.S.C. 154(b) by 0 days.

(21) Appl. No.: 11/462,627

(22) Filed: Aug. 4, 2006

(51) Int. Cl.
*H03L 7/06* (2006.01)

(52) U.S. Cl. .................. 327/157; 327/148; 327/291

(58) Field of Classification Search .............. None
See application file for complete search history.

(56) References Cited

U.S. PATENT DOCUMENTS

| | | | |
|---|---|---|---|
| 5,191,295 A * | 3/1993 | Necoechea | 327/244 |
| 5,245,637 A | 9/1993 | Gersbach | |
| 6,359,486 B1 | 3/2002 | Chen | |
| 6,483,886 B1 * | 11/2002 | Sung et al. | 375/376 |
| 6,526,374 B1 * | 2/2003 | Martin | 703/14 |
| 6,542,013 B1 * | 4/2003 | Volk et al. | 327/115 |
| 6,690,223 B1 | 2/2004 | Wan | |
| 6,809,600 B2 * | 10/2004 | Chang et al. | 331/17 |
| 6,943,598 B2 * | 9/2005 | Ghazali et al. | 327/147 |
| 6,943,599 B2 * | 9/2005 | Ngo | 327/156 |
| 7,042,258 B2 * | 5/2006 | Booth et al. | 327/115 |
| 7,054,404 B2 | 5/2006 | Saeki | |
| 7,116,144 B1 * | 10/2006 | Cheng | 327/156 |
| 7,323,916 B1 * | 1/2008 | Sidiropoulos et al. | 327/156 |
| 2006/0078079 A1 * | 4/2006 | Lu | 375/376 |

OTHER PUBLICATIONS

Sidiropoulos et al., A Semidigital Dual Delay-Locked Loop, Nov. 2007, IEEE Journal of Solid-State Circuits, vol. 32, No. 11, pp. 1683-1692.*

Stojanovic, et al., "Transmit Pre-emphasis for High-Speed Time-Division-Multiplexed Serial-Link Transceiver," IEEE International Conference on Communications, Apr. 2002, pp. 1934-1939.

* cited by examiner

*Primary Examiner*—Cassandra Cox
(74) *Attorney, Agent, or Firm*—Stanley J. Pawlik; Glass & Associates

(57) ABSTRACT

A clock generator generates multiple clock signals based on an input signal and adjusts the phases of the clock signals relative to a phase of the input signal, based on a control signal. The clock generator includes a phase locked loop that includes a phase shift unit. The phase shift unit selects some of the clock signals based on the control signal and generates a feedback signal based on the selected clock signals. The feedback signal has a phase based on the phases of the selected clock signals. The phase locked loop aligns the phase of the feedback signal with the phase of the input signal. In this process, the phase locked loop shifts the phase of each of the clock signals relative to the phase of the input signal.

13 Claims, 8 Drawing Sheets

MULTIPHASE CLOCK GENERATOR

BACKGROUND

1. Field of the Invention

The present invention generally relates to electronic circuits for generating clock signals, and more particularly to multiphase clock generators.

2. Description of Related Art

High-speed serial communication systems transmit and receive data in serial data streams. A serial data stream is a sequence of digital pulses that represents data as a sequence of binary values. A transmitter in the serial communication system uses a clock signal to encode data into a serial data stream and transmits the serial data stream to a receiver in the serial communication system. The receiver generates a clock signal having the same frequency as the clock signal in the transmitter and uses the clock signal to extract and reconstruct the data from the serial data stream.

Some receivers include a clock generator that extracts and reconstructs a clock signal from the serial data stream. The reconstructed clock signal has the same frequency as the clock signal used by transmitter to encode data into the serial data stream. In some receivers, the clock generator reconstructs a multiphase clock signal that includes in-phase clock signals and quadrature clock signals. The in-phase clock signals differ in phase by 180 degrees. The quadrature clock signals differ in phase by 180 degrees. Further, each of the quadrature clock signals differs in phase from each of the in-phase clock signals by 90 degrees. The clock generator aligns the phases of the in-phase clock signals to data transition points in the serial data stream and uses the quadrature clock signals to extract data between data transition points in the serial data stream.

In many high-speed communications systems, the clock generator of a receiver includes a phase interpolator for each of the in-phase and quadrature clock signals. The phase interpolator of each of the in-phase clock signals adjusts the phase of that clock signal to align the clock signal with data transition points in the serial data stream. The phase interpolator of each of the quadrature clock signals adjusts the phase of that clock signal to maintain its phase relationship with the in-phase clock signals. Although phase interpolators have been successfully used to adjust the phases of clock signals generated in a receiver, phase interpolators generally consume a considerable amount of power and area in those applications in which multiple phase interpolators are used. In particular, multiple phase interpolators consume a considerable amount of power and chip area in integrated circuit applications. Moreover, performance variations among multiple phase interpolators in a receiver tend to cause timing jitter between the phases of the clock signals generated by the phase interpolators. The timing jitter decreases the accuracy of the clock generator in maintaining the phase relationships of the generated clock signals, which decreases performance of the receiver.

In light of the above, a need exists for reducing power and area consumption of a multiphase clock generator. A further need exists for improving the accuracy of a multiphase clock generator.

SUMMARY

In various embodiments, a clock generator generates multiple clock signals, based on an input signal, and shifts the phases of the clock signals relative to a phase of the input signal, based on a control signal. The clock generator includes a phase locked loop that includes a phase shift unit. The phase shift unit selects some of the clock signals based on the control signal and generates a feedback signal of the phase locked loop based on the selected clock signals. The feedback signal has a phase based on the phases of the selected clock signals. The phase locked loop aligns the phase of the feedback signal with the phase of the input signal. In this process, the phase locked loop shifts the phase of each of the clock signals relative to the phase of the input signal. By including the phase shift unit in the phase locked loop, the clock generator need not have an individual phase shift unit for each of the clock signals. Consequently, the clock generator consumes less power and area. In particular, the clock generator consumes less power and chip area in an integrated circuit. Further, using a single phase shift unit in the clock generator reduces timing jitter between the phases of the clock signals generated by the clock generator, which improves the accuracy of the clock generator.

A clock generator, in accordance with one embodiment, includes a phase detector, a charge pump, a low pass filter, a voltage controlled oscillator, and a phase shift unit. The charge pump is coupled to the phase detector and the low pass filter. The voltage controlled oscillator is coupled to the low pass filter and the phase shift unit. The phase shift unit is coupled to the phase detector. The phase detector generates a phase difference signal for aligning a phase of an input signal with a phase of a feedback signal. The phase difference signal represents a phase difference between the phase of the input signal and the phase of the feedback signal. The charge pump generates a voltage signal based on the phase difference signal. The voltage signal includes a voltage that represents the phase difference between the phase of the input signal and the phase of the feedback signal. The low pass filter generates a first control signal by smoothing the voltage signal. The voltage controlled oscillator generates a plurality of clock signals having an oscillation frequency based on the first control signal. Each of these clock signals has a phase. Further, the clock signals have a substantially constant phase relationship with each other. The phase shift unit selects clock signals based on a second control signal. Additionally, the phase shift unit generates the feedback signal based on the selected clock signals.

A clock generator, in accordance with one embodiment, includes a phase detector, a charge pump, a low pass filter, a voltage controlled oscillator, a phase shift unit, and a frequency divider circuit. The charge pump is coupled to the phase detector and the low pass filter. The voltage controlled oscillator is coupled to the low pass filter and the phase shift unit. The frequency divider is coupled to the phase shift unit and the phase detector. The phase detector generates a phase difference signal for aligning a phase of an input signal with a phase of a feedback signal. The phase difference signal represents a phase difference between the phase of the input signal and the phase of the feedback signal. The charge pump generates a voltage signal based on the phase difference signal. The voltage signal includes a voltage that represents the phase difference between the phase of the input signal and the phase of the feedback signal. The low pass filter generates a first control signal by smoothing the voltage signal. The voltage controlled oscillator generates multiple clock signals having an oscillation frequency based on the first control signal. Each of these clock signals has a phase. Further, the clock signals have a substantially constant phase relationship with each other. The phase shift unit selects clock signals based on a second control signal. Further, the phase shift unit generates the phase signal based on the selected clock signals.

The phase of the phase signal is based on the phases of the selected clock signals. The frequency divider generates the feedback signal by dividing the frequency of the phase signal.

A method for generating a multiphase clock, in accordance with one embodiment, includes generating a first control signal representing a phase difference between a phase of an input signal and a phase of a feedback signal. The method also includes generating a plurality of clock signals having an oscillation frequency based on the first control signal. Each of these clock signals has a phase. Moreover, the clock signals have a substantially constant phase relationship with each other. Further, the method includes selecting clock signals based on a second control signal. Additionally, the method includes generating the feedback signal based on the selected clock signals. The phase of the feedback signal is based on the phases of the selected clock signals.

A system for generating a multiphase clock, in accordance with one embodiment, includes a means for generating a first control signal representing a phase difference between a phase of an input signal and a phase of a feedback signal. The system further includes a means for generating a plurality of clock signals having an oscillation frequency based on the first control signal. Each of the clock signals has a phase, and the clock signals have a substantially constant phase relationship with each other. Additionally, the system includes a means for selecting clock signals based on a second control signal. The system also includes a means for generating the feedback signal based on the selected clock signals.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

In various embodiments, a clock generator generates multiple clock signals based on an input signal and a feedback signal. The multiple clock signals differ in phase from each other and each has a phase relationship with the input signal. The clock generator selects clock signals based on a control signal and determines a phase of the feedback signal. The phase of the feedback signal is based on the phases of the selected clock signals. Further, the clock generator adjusts the phase relationships between the multiple clock signals and the input clock signal based on the feedback signal. In this way, the clock generator adjusts the phases of the multiple clock signals based on the control signal.

Figure 1:
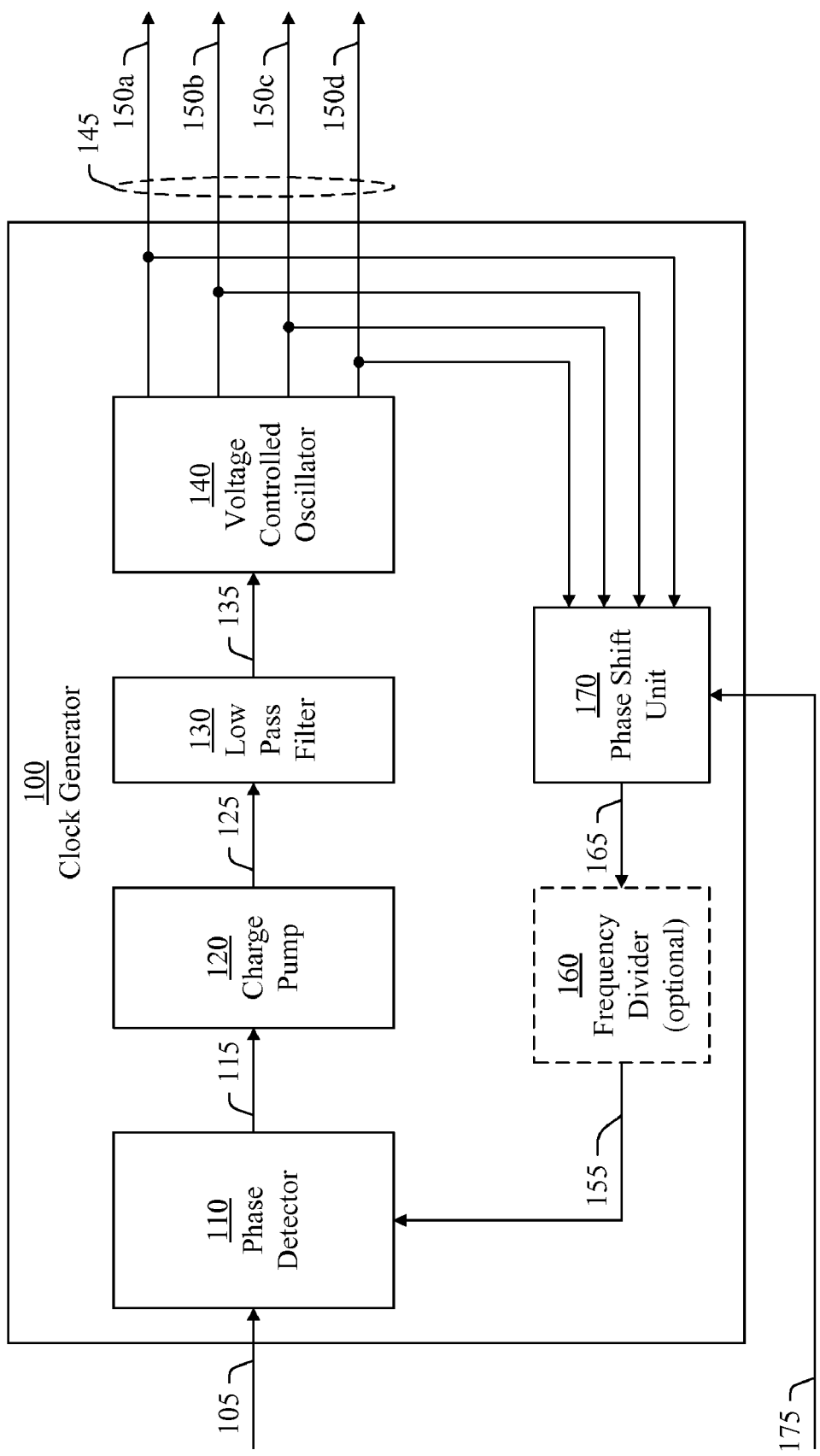
FIG. 1 is a block diagram of clock generator, in accordance with an embodiment of the present invention.

FIG. 1 illustrates clock generator 100, in accordance with an embodiment of the present invention. The clock generator 100 receives an input signal 105 and generates a multiphase clock signal 145 based on the input signal 105 and a control signal 175. Each of the input signal 105 and the multiphase clock signal 145 has an oscillation frequency. For example, the input signal 105 may be a reference clock signal having a constant oscillation frequency. The multiphase clock signal 145 includes multiple clock signals 150 (e.g., the clock signals 150a-d). The clock signals 150 have the same oscillation frequency as the multiphase clock signal 145 but differ in phase from each other. The clock generator 100 shifts the phase of each clock signal 150 relative to a phase of the input signal 105 based on the control signal 175, as is described more fully herein. Although four clock signals 150a-d are illustrated in FIG. 1, the clock generator 100 may generate more or fewer clock signals 150 in other embodiments.

The clock generator 100 includes a phase detector 110, a charge pump 120, a low pass filter 130, a voltage controlled oscillator 140, a phase shift unit 170, and an optional frequency divider 160. The charge pump 120 is coupled to the phase detector 110 and the low pass filter 130. The voltage controlled oscillator 140 is coupled to the low pass filter 130 and the phase shift unit 170. In embodiments without the frequency divider 160, the phase shift unit 170 is coupled to the phase detector 110. In embodiments with the frequency divider 160, the phase shift unit 170 is coupled to the frequency divider 160, and the frequency divider 160 is coupled to the phase detector 110.

The phase detector 110 generates a phase difference signal 115 representing a phase difference between the phase of the input signal 105 and a phase of the feedback signal 155. The charge pump 120 generates a voltage signal 125 based on the phase difference signal 115. The voltage signal 125 has a voltage that represents the phase difference between the phase of the input signal 105 and the phase of the feedback signal 155. The low pass filter 130 generates a control signal 135 by smoothing the voltage signal 125 generated by the charge pump 120. For example, the low pass filter 130 may smooth a voltage waveform of the voltage signal 125 by passing lower frequency components of the voltage signal 125 and filtering out (e.g., attenuating) higher frequency components of the voltage signal 125. The voltage controlled oscillator 140 generates the multiphase clock signal 145 based on the control signal 135. Further, the voltage controlled oscillator 140 determines the oscillation frequency of each clock signal 150 and a phase relationship between the phase of each clock signal 150 and the phase of the input signal 105, based on the control signal 135.

In addition to the phase relationship with the input signal 105, each of the clock signals 150 has a phase relationship with each of the other clock signals 150. The phase relationship between two given clock signals 150 is a difference between the phases of those clock signals 150. A phase difference may be expressed as a number of degrees of a clock cycle (e.g., a phase angle) of a clock signal 150 or as a distance in time between similar points on the waveforms of the clock signals 150. For example, a phase difference may be expressed as a distance in time between the peaks of two clock signals 150 or as a distance in time between rising edges of two clock signals 150. In various embodiments, each of the phase relationships between the clock signals 150 is substantially constant. In one embodiment, the clock signals 150 include in-phase and quadrature clock signals. For example, the clock signal 150a may be an in-phase clock signal and the clock signal 150c may be a quadrature clock signal.

The phase shift unit 170 generates a phase signal 165 based on the multiphase clock signal 145 and a control signal 175. In various embodiments, the phase signal 165 has the same oscillation frequency as the multiphase clock signal 145. Further, the phase shift unit 170 selects clock signals 150 in the multiphase clock signal 145 based on the control signal 175 and generates the phase signal 165 based on the selected clock signals 150. The phase shift unit 170 determines a phase of the phase signal 165 based on the selected clock signals 150. In various embodiments, the phase of the phase signal 165 may be any number of degrees (e.g., any phase angle) in a 360 degree clock cycle.

In one embodiment, the phase shift unit 170 interpolates the phase of the phase signal 165 based on phases of the selected clock signals 150 such that the phase of the phase signal 165 is between the phases of two of the selected clock signals 150. For example, the phase shift unit 170 may interpolate the phase of the phase signal 165 by combining the selected clock signals 150. In a further embodiment, the phase shift unit 170 determines a scale factor for each of the selected clock signals 150 to position the phase of the phase signal 165 between the phases of the selected clock signals 150. For example, the phase shift unit 170 may determine a higher scale factor for one of the selected clock signals 150 to position the phase of the phase signal 165 closer to the phase of that selected clock signals 150 than the phase of another selected clock signal 150. In one embodiment, the phase shift unit 170 multiplies voltage amplitudes of the selected clock signals by the corresponding scale factors to position the phase of the phase signal 165 between the phases of the selected clock signals 150.

In embodiments not including the frequency divider 160, the phase signal 165 is the feedback signal 155. In these embodiments, the phase shift unit 170 generates the feedback signal 155 (e.g., the phase signal 165) and provides the feedback signal 155 to the phase detector 110. In embodiments including the frequency divider 160, the frequency divider 160 generates the feedback signal 155 based on the phase signal 165 by dividing the oscillation frequency of the phase signal 165. For example, the frequency divider 160 may divide the oscillation frequency of the phase signal 165 by a positive integer N. In these embodiments, the oscillation frequency of the multiphase clock signal 145 is a integer multiple N of the oscillation frequency of the input signal 105 when the oscillation frequency of the feedback signal 155 is the same as the oscillation frequency of the input signal 105 (e.g., the oscillation frequency of the feedback signal 155 is locked to the oscillation frequency of the input signal 105).

In operation, the clock generator 100 locks the oscillation frequency of the feedback signal 155 to the oscillation frequency of the input signal 105. Further, the clock generator 100 locks the phase of the feedback signal 155 to the phase of the input signal 105. In this process, the voltage controlled oscillator 140 adjusts the oscillation frequency of the multiphase clock signal 145 such that the input signal 105 and the feedback signal 155 attain the same oscillation frequency and the same phase. Also in this process, the voltage controlled oscillator 140 shifts the phase of each clock signal 150 relative to the phase of the input signal 105.

The phase shift unit 170 may also shift the phase of the feedback signal 155 based on the control signal 175 when the input signal 105 and the feedback signal 155 have the same oscillation frequency and phase. In this case, the voltage controlled oscillator 140 adjusts the phase of each clock signal 150 such that the input signal 105 and the feedback signal 155 attain the same oscillation frequency and the same phase. In this way, clock generator 100 shifts the phase of each of the clock signals 150 in the multiphase clock signal 145 based on the control signal 175.

Figure 2:
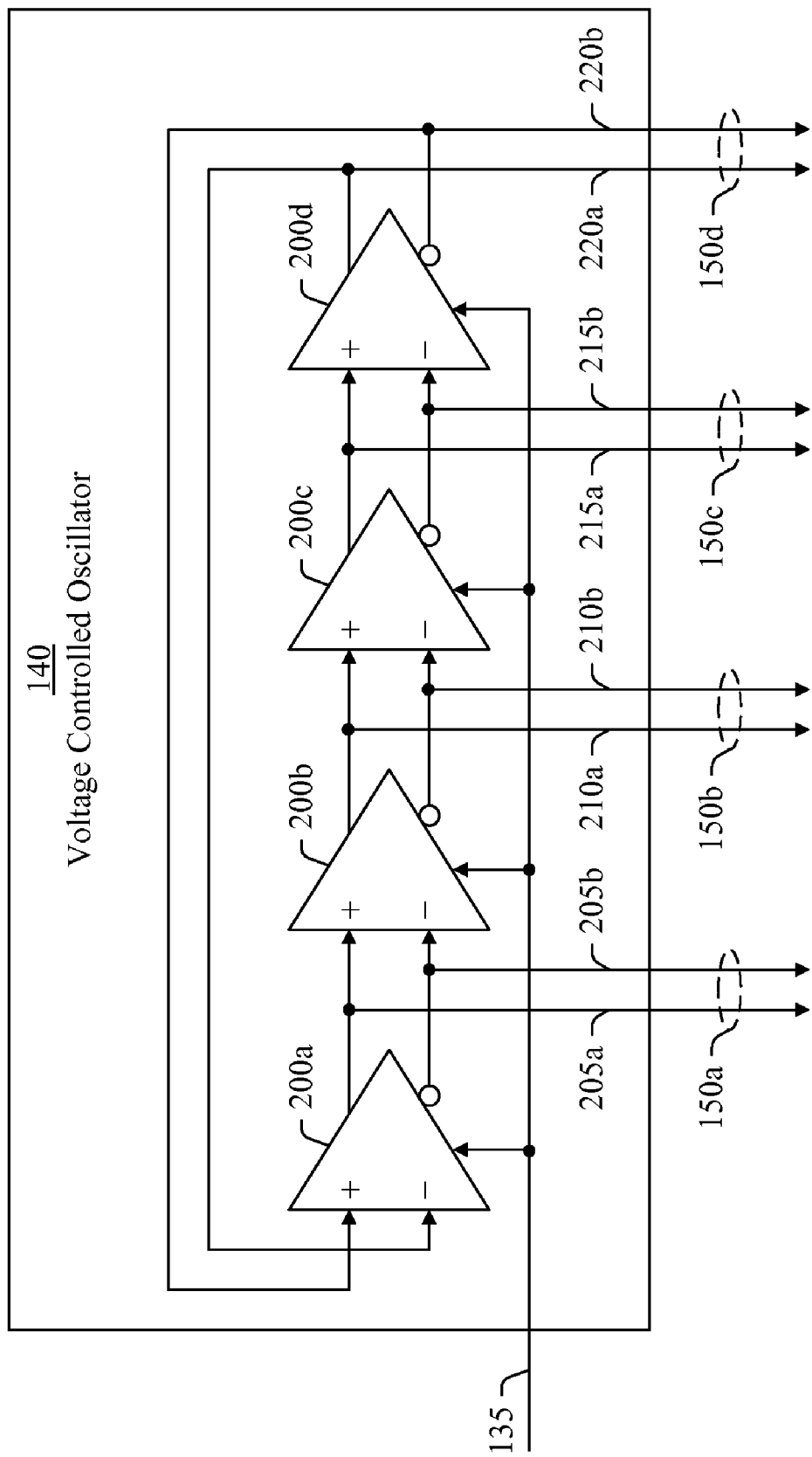
FIG. 2 is a block diagram of a voltage controlled oscillator, in accordance with an embodiment of the present invention.

FIG. 2 illustrates the voltage controlled oscillator 140, in accordance with an embodiment of the present invention. In this embodiment, each of the clock signals 150 includes differential clock signals and the voltage controlled oscillator 140 includes differential buffers 200 (e.g., differential buffers 200a-d) arranged in a ring. Each of the differential buffers 200 is coupled to a preceding differential buffer 200 in the ring and to a succeeding differential buffer 200 in the ring. One of the differential buffers 200 (e.g., the differential buffer 200d) receives a differential signal from the preceding differential buffer 200 in the ring, inverts the differential signal, and outputs the inverted differential signal to the succeeding differential buffer 200 (e.g., the differential buffer 200a) in the ring. Each of the other differential buffers 200 (e.g., the differential buffers 200a-c) receives a differential signal from the proceeding differential buffer 200 in the ring and outputs the differential signal to the succeeding differential buffer 200 in the ring.

Each of the differential buffers 200 introduces a propagation delay into the differential signal received from the preceding differential buffer 200 in the ring. Consequently, the differential signals output from the differential buffer 200 have different phases with respect to each other. Further, the differential signals output from the differential buffers 200 each have a clock period determined by the sum of the propagation delays through the differential buffers 200 in the ring. For example, the clock period of each of the differential signals output from the differential buffers 200 may have a clock period equal to twice the sum of the propagation delays through the differential buffers 200 in the ring. At least some of the differential signals output from the differential buffers 200 are the clock signals 150 of the multiphase clock signal 145. In other embodiments, the voltage controlled oscillator 140 may include additional buffers to buffer the clock signals 150.

In operation, the differential signal output from each of the differential buffers 200 oscillates at an oscillation frequency based on the propagation delays of the differential buffers 200. Moreover, the delay of each differential buffer 200 is determined based on the control signal 135. In this way, the voltage controlled oscillator 140 determines the oscillation frequency of the multiphase clock signal 145 and the oscillation frequency of each of the clock signals 150 in the multiphase clock signal 145.

In the embodiment of FIG. 2, the voltage controlled oscillator 140 includes four differential buffers 200a-d. The differential buffer 200a receives the clock signal 150d from the differential buffer 200d, and outputs the clock signal 150a. The clock signal 150a includes differential clock signals 205a and 205b. The differential buffer 200b receives the clock signal 150a from the differential buffer 200a and outputs the clock signal 150b. The clock signal 150b includes differential clock signals 210a and 210b. The differential buffer 200c receives the clock signal 150b from the differential buffer 200b and generates the clock signal 150c. The clock signal 150c includes the differential clock signals 215a and 215b. The differential buffer 200d receives the clock signal 150c from the differential buffer 200c and generates the clock signal 150d. The clock signal 150d includes differential clock signals 220a and 220b. In other embodiments, the voltage controlled oscillator 140 may have more or fewer than four differential buffers 200. Further, some of the differential buffers 200 in the ring need not generate one of the clock signals 150.

Figure 3:
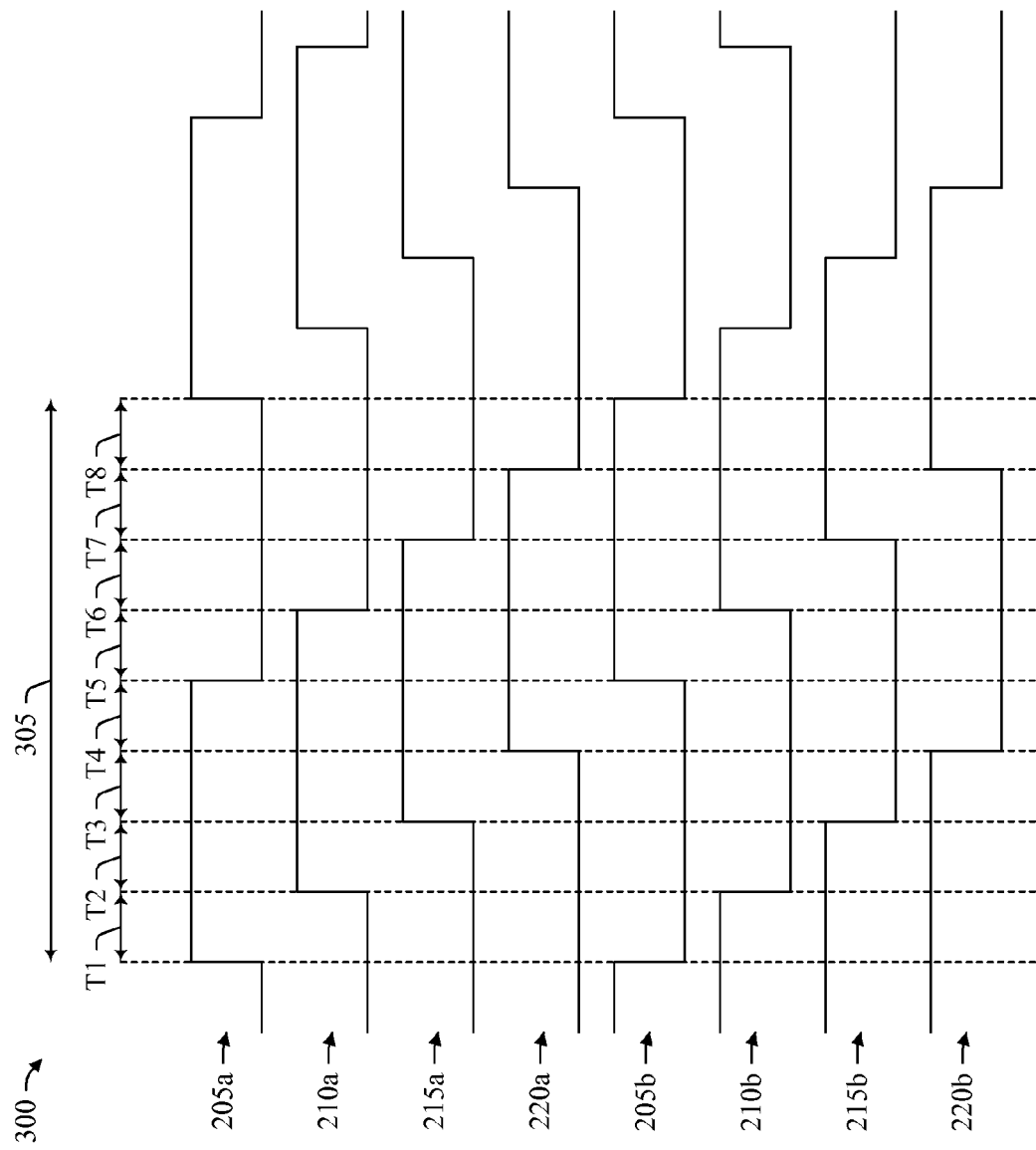
FIG. 3 is a timing diagram of clock signals generated by a clock generator, in accordance with an embodiment of the present invention.

FIG. 3 illustrates a timing diagram 300 of the clock signals 205a-b, 210a-b, 215a-b, and 220a-b, in accordance with an embodiment of the present invention. Each of the clock signals 205a-b, 210a-b, 215a-b, or 220a-b has a clock period 305 defining a clock cycle for that clock signal 205a-b, 210a-b, 215a-b, or 220a-b. For example, the clock period 305 of each of the clock signals 205a-b, 210a-b, 215a-b, or 220a-b may be a time interval between successive rising edges (or falling edges) of that clock signal 205a-b, 210a-b, 215a-b, or 220a-b. In the embodiment of FIG. 3, the clock period 305 includes eight intervals T1-T8 (e.g., time intervals). Each of the intervals T1-T8 is between adjacent rising edges (or falling edges) of the clock signals 205a-b, 210a-b, 215a-b, or 220a-b, which define that interval T1-T8. In some embodiments, the intervals T1-T8 have a same duration. In this way, the clock period 305 is evenly divided into the eight intervals T1-T8. In other embodiments, some or all of the intervals T1-T8 may have a different duration than that of the other intervals T1-T8.

As illustrated in FIG. 3, the interval T1 is between the rising edges of the clock signals 205a and 210a, the interval T2 is between the rising edges of the clock signals 210a and 215a, and the interval T3 is between the rising edges of the clock signals 215a and 220a. The interval T4 is between the rising edges of the clock signals 220a and 205b, the interval T5 is between the rising edges of the clock signals 205b and 210b, and the interval T6 is between the rising edges of the clock signals 210b and 215b. Further, the interval T7 is between the rising edges of the clock signals 215b and 220b, and the interval T8 is between the rising edges of the clock signals 220b and 205a. Although eight intervals T1-T8 and eight clock signals 205a-b, 210a-b, 215a-b, and 220a-b are illustrated in FIG. 3, the clock period 305 may have more or fewer intervals T1-T8 and more or fewer clock signals 205a-b, 210a-b, 215a-b, or 220a-b in other embodiments.

Figure 4:
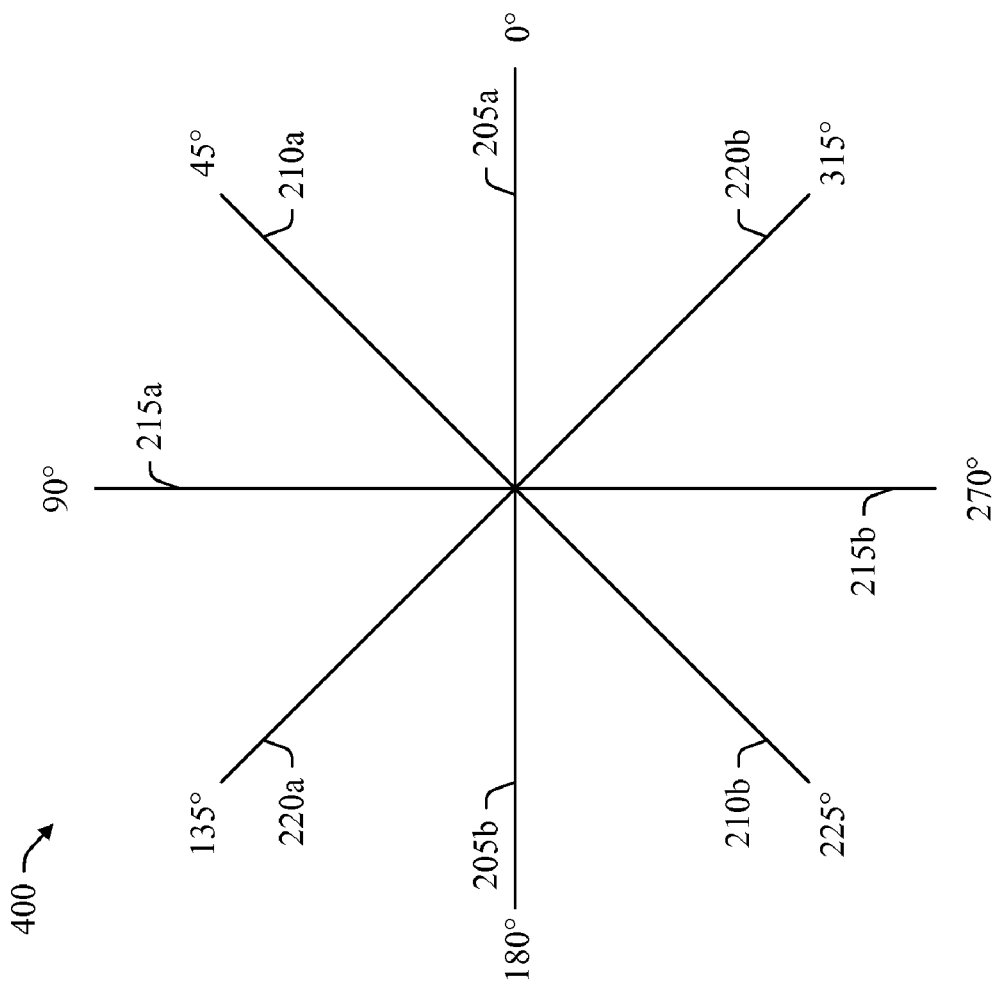
FIG. 4 is a phase diagram of clock signals generated by a clock generator, in accordance with an embodiment of the present invention.

FIG. 4 illustrates a phase diagram 400 of the clock signals 205a-b, 210a-b, 215a-b, and 220a-b, in accordance with an embodiment of the present invention. The phase diagram 400 illustrates phase relationships of the clock signals 205a-b, 210a-b, 215a-b, and 220a-b in a clock cycle (e.g., a clock cycle of the clock signal 205a). As illustrated in FIG. 4, the clock signal 205a has a phase of zero degrees, the clock signal 210a has a phase of 45 degrees, the clock signal 215a has a phase of 90 degrees, and the clock signal 220a has a phase of 135 degrees. Further, the clock signal 205b has a phase of 180 degrees, the clock signal 210b has a phase of 225 degrees, the clock signal 215b has a phase of 270 degrees, and the clock signal 220b has a phase of 315 degrees. The phase relationship between two of the clock signals 205a-b, 210a-b, 215a-b, or 220a-b is a difference between the phases of those two clock signals 205a-b, 210a-b, 215a-b, or 220a-b.

Figure 5:
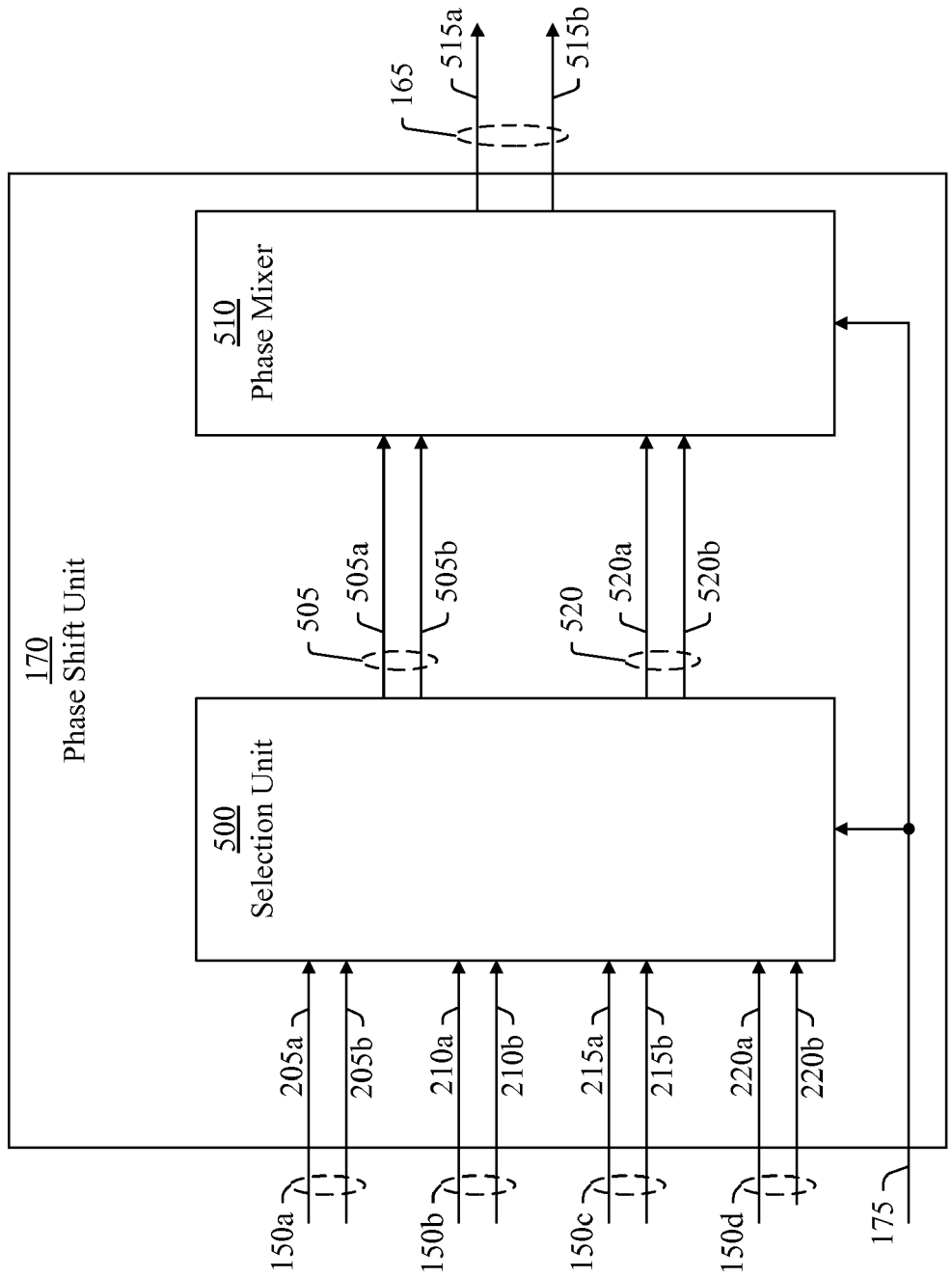
FIG. 5 is a block diagram of a phase shift unit, in accordance with an embodiment of the present invention.

FIG. 5 illustrates the phase shift unit 170, in accordance with an embodiment of the present invention. The phase shift unit 170 includes a selection unit 500 and a phase mixer 510 coupled to the selection unit 500. The selection unit 500 selects two of the clock signals 150 of the multiphase clock signal 145 based on the control signal 175. Further, the selection unit 500 outputs one of the selected clock signals 150 as a clock signal 505, and outputs the other selected clock signal 150 as a clock signal 520. The phase mixer 510 generates the phase signal 165 based on the control signal 175 and the clock signals 505 and 520 such that phase of the phase signal 165 is between phases of the clock signals 505 and 520. In some embodiments, the phase mixer 510 may generate the phase signal 165 such that the phase of the phase signal 165 is substantially the same as the phase of one of the clock signals 505 and 520. In this way, the selection unit 500 in combination with the phase mixer 510 may determine the phase of the phase signal 165 to be any phase in a clock cycle (e.g., any phase from zero degrees to 360 degrees). Although the selection unit 500 selects two clock signals 150 in the embodiment of FIG. 5, the selection unit 500 may select more or fewer than two clock signals 150 in other embodiments. Further, the phase mixer 510 may generate the phase signal 165 based on more than two selected clock signals 150.

The selection unit 500 may be any circuit or device that selects the clock signals 150 based on the control signal 175. For example, the selection unit 500 may be a multiplexer. In one embodiment, the selection unit 500 may also invert one or both of the selected clock signals 150 based on the control signal 175. The phase mixer 510 may be any circuit or device that generates the phase signal 165 such that the phase of the phase signal 165 is based on the phases of the clock signals 505 and 520. For example, the phase mixer 510 may be a phase interpolator that interpolates the phase of the phase signal 165 such that the phase of the phase signal 165 is between the phases of the clock signals 505 and 520.

In one embodiment, the clock signal 505 includes differential clock signals 505a and 505b, the clock signal 520 includes differential clock signals 520a and 520b, and the phase signal 165 includes differential clock signals 515a and 515b. In this embodiment, the selection unit 500 selects a pair of the differential clock signals 205a-b, 210a-b, 215a-b, or 220a-b based on the control signal 175 and outputs the selected pair of differential clock signals as the differential clock signals 505a and 505b. Further, the selection unit 500 selects a pair of the differential clock signals 205a-b, 210a-b, 215a-b, or 220a-b based on the control signal 175 and outputs the selected pair of differential clock signals as the differential clock signals 520a and 520b.

In another embodiment, the selection unit 500 individually selects some of the clock signals 205a-b, 210a-b, 215a-b, and 220a-b and passes these clock signals as the differential clock signals 505a-b and 520a-b. For example, the selection unit 500 may pass the clock signal 205a as the clock signal 505a and may pass the clock signal 210b as the clock signal 505b. In other embodiments, the selection unit 500 may select other combinations of clock signals 205a-b, 210a-b, 215a-b, or 220a-b to generate the differential clock signals 505 and 520.

Figure 6:
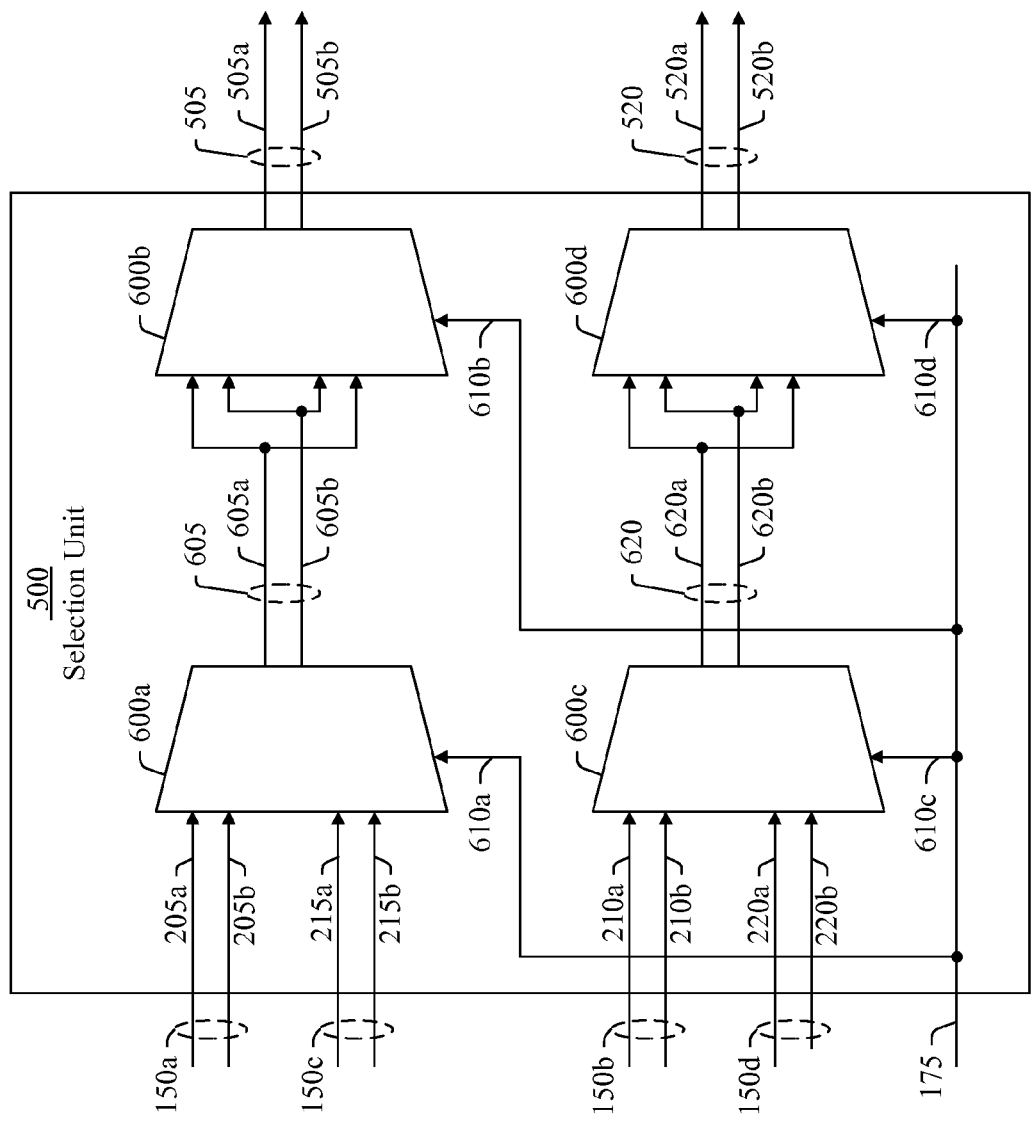
FIG. 6 is a block diagram of a selection unit, in accordance with an embodiment of the present invention.

FIG. 6 illustrates the selection unit 500, in accordance with an embodiment of the present invention. In this embodiment, the selection unit 500 includes four multiplexers 600a-d and the control signal 175 includes four control signals 610a-d. For example, the control signal 175 may be a control bus. The multiplexer 600a is coupled to the multiplexer 600b, and the multiplexer 600c is coupled to the multiplexer 600d. Further, each of the multiplexers 600a-d receives one of the control signals 610a-d in the control signal 175. Although four multiplexers 600a-d and four control signals 610a-d are illustrated in FIG. 6, the selection unit 500 may have more or fewer multiplexers 600 and more or fewer control signals 610 in other embodiments.

The multiplexer 600a selects one of the clock signals 150a or 150c based on the control signal 610a and outputs the selected clock signal (e.g., the clock signal 150a or 150c) as the clock signal 605. The clock signal 605 includes differential clock signals 605a and 605b. The multiplexer 600b outputs the clock signal 605 as a clock signal 505 or inverts the clock signal 605 and outputs the inverted clock signal as the clock signal 505, based on the control signal 610b. For example, the multiplexer 600b may invert the clock signal 605 by passing the clock signal 605a as the clock signal 505b, and passing the clock signal 605b as the clock signal 505a.

The multiplexer 600c selects one of the clock signals 150b or 150d, based on the control signal 610c, and outputs the selected clock signal (e.g., the clock signal 150b or 150d) as the clock signal 620. The clock signal 620 includes differential clock signals 620a and 620b. The multiplexer 600d outputs the clock signal 620 as a clock signal 520 or inverts the clock signal 620 and outputs the inverted clock signal as the clock signal 520, based on the control signal 610d. For example, the multiplexer 600d may invert the clock signal 620 by passing the clock signal 620a as the clock signal 520b, and passing the clock signal 620b as the clock signal 520a.

In one embodiment, the control signals 610a-d are used to select the intervals T1-T8 defined by the rising edges (or falling edges) of the clock signals 205a-b, 210a-b, 215a-b, or 220a-b. Further, the control signals 610a-d may be used to cycle through the intervals T1-T8. For example, the control signals 610a-d may be used to cycle through the intervals T1-T8 in a sequential order.

Figure 7:
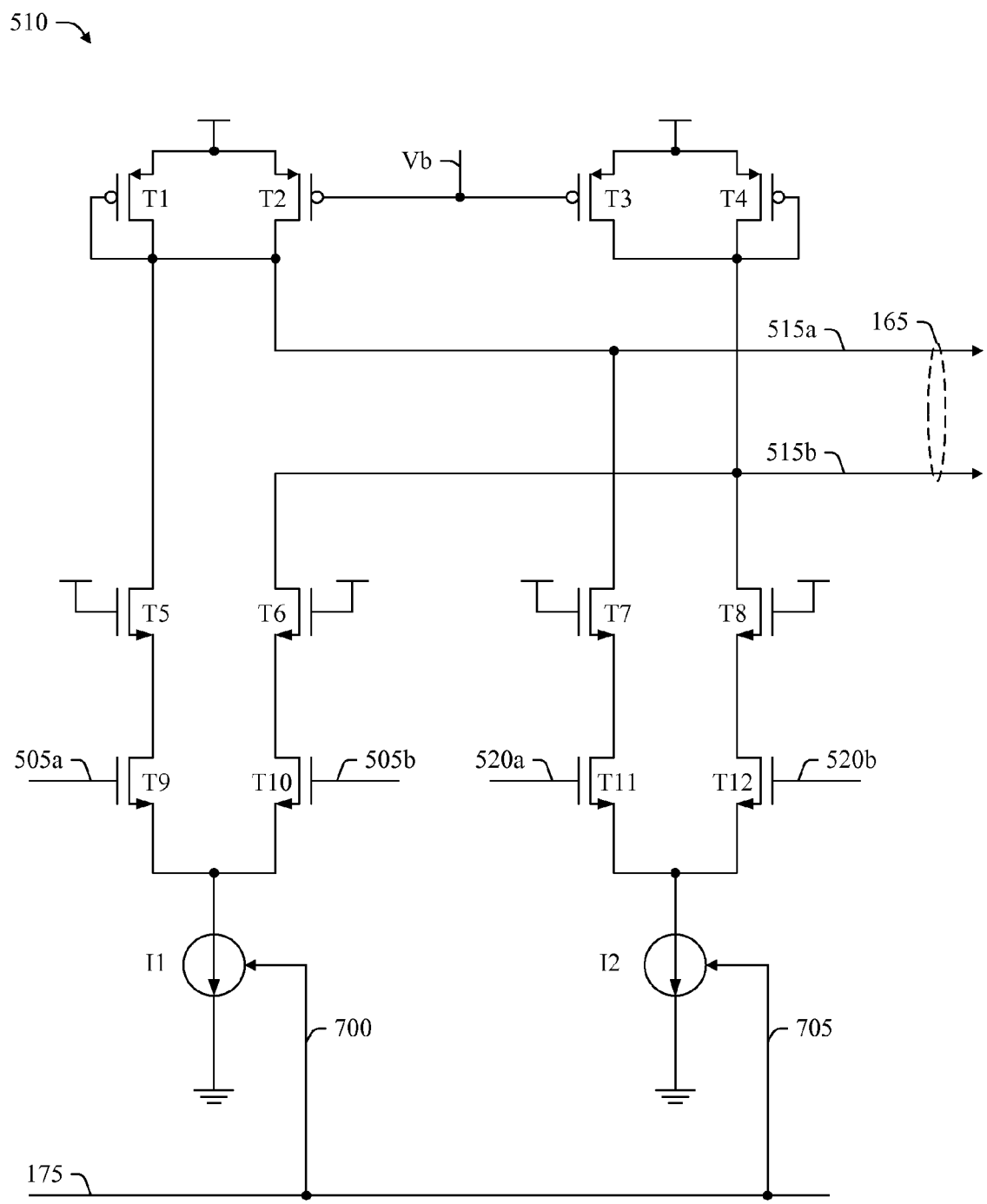
FIG. 7 is a block diagram of a phase mixer, in accordance with an embodiment of the present invention.

FIG. 7 illustrates the phase mixer 510, in accordance with an embodiment of the present invention. The phase mixer 510 includes transistors T1-T12 and current sources I1 and I2. The transistors T1-T4 are p-type transistors, such as P-type Metal-Oxide-Semiconductor (PMOS) transistors. The transistors T5-T12 are n-type transistors, such as N-type Metal-Oxide-Semiconductor (NMOS) transistors. In other embodiments, the transistors T1-T12 may be other types of transistors. The current sources I1 and I2 may be any circuit or device for generating a current. For example, each of the current sources I1 and I2 may be an NMOS transistor that generates a current at its drain.

One end of the current source I1 is connected to a source of each of the transistors T9 and T10. The other end of the current source I1 is connected to a ground potential (e.g., Vss). One end of the current source I2 is connected to a source of each of the transistors T11 and T12. The other end of the current source I2 is connected to a ground potential. A gate of the transistor T9 receives the clock signal 505a and a gate of the transistor T10 receives the clock signal 505b. The differential clock signals 505a-b control the flow of the current generated by the current source I1 though the transistors T9 and T10. A gate of the transistor T11 receives the clock signal 520a and a gate of the transistor T12 receives the clock signal 520b. The differential clock signals 520a-b control the flow of the current generated by the current source I2 though the transistors T11 and T12.

A drain of the transistor T9 is connected to a source of the transistor T5, and a drain of the transistor T10 is connected to a source of the transistor T6. A drain of the transistor T11 is connected to a source of the transistor T7, and a drain of the transistor T12 is connected to a source of the transistor T8. A gate of each of the transistors T5-T8 is connected to a supply voltage (e.g., Vdd).

A source of each of the transistors T1-T4 is connected to the supply voltage. A gate of the transistor T1 is connected to a drain of each of the transistors T1, T2, T5, and T7. The phase mixer 510 generates the clock signal 515a at a junction between the gate of the transistor T1 and the drains of the transistors T1, T2, T5, and T7. A gate of the transistor T4 is connected to a drain of each of the transistors T3, T4, T6, and T8. The phase mixer 510 generates the clock signal 515b at a junction between the gate of the transistor T4 and the drains of the transistors T3, T4, T6, and T8. Further, a gate of the transistor T2 is connected to a gate of the transistor T3. The gate of each of the transistors T2 and T3 is connected to a bias voltage Vb, which establishes a direct current (DC) operating point for the phase mixer 510.

In some embodiments, the control signal 175 includes a control signal 700, which determines a scaling factor for the current generated by the current source I1. Further, the control signal 175 includes a control signal 705, which determines a scaling factor for the current generated by the current source I2. In these embodiments, the current generated by the current source I1 is based on the control signal 700, and the current generated by the current source I2 is based on the control signal 705. By scaling the currents generated by the current sources I1 and I2, the phase mixer 510 adjusts the phase relationships between the phase of the phase signal 165 and the phases of the clock signals 505 and 520. For example, the sum of the currents generated by the current sources I1 and I2 may be a constant current I, and the phase mixer 510 may scale the currents generated by the current sources I1 and I2 such that the current generated by the current source I1 is 0.9*I and the current generated by the current source I2 is 0.1*I. In this example, the phase of the phase signal 165 is closer to the phase of the clock signal 505 than to the phase of the clock signal 520 as a result of the scaling.

In various embodiments, the transistors T5-T8 are optional. In some embodiments without the transistors T5-T8, the drain of each of the transistors T1 and T2 is connected to the drain of each of the transistors T9 and T11, and the drain of each of the transistors T3 and T4 is connected to the drain of each of the transistors T10 and T12. Further, the phase mixer 510 generates the clock signal 515a at a junction between the gate of the transistor T1 and the drains of the transistors T1, T2, T9, and T11. The phase mixer 510 generates the clock signal 515b at a junction between the gate of the transistor T4 and the drains of the transistors T3, T4, T10, and T12.

In various embodiments, the transistors T1-T4 are optional. In embodiments without the transistors T1-T4, the phase mixer 510 includes a resistive load, such as a resistor, instead of the pair of transistors T1 and T2. Further, the phase mixer 510 includes a resistive load, such as a resistor, instead of the pair of transistors T3 and T4. In various embodiments, the phase mixer 510 is a conventional phase mixer or a conventional phase interpolator, as would be appreciated by one skilled in the relevant art.

Figure 8:
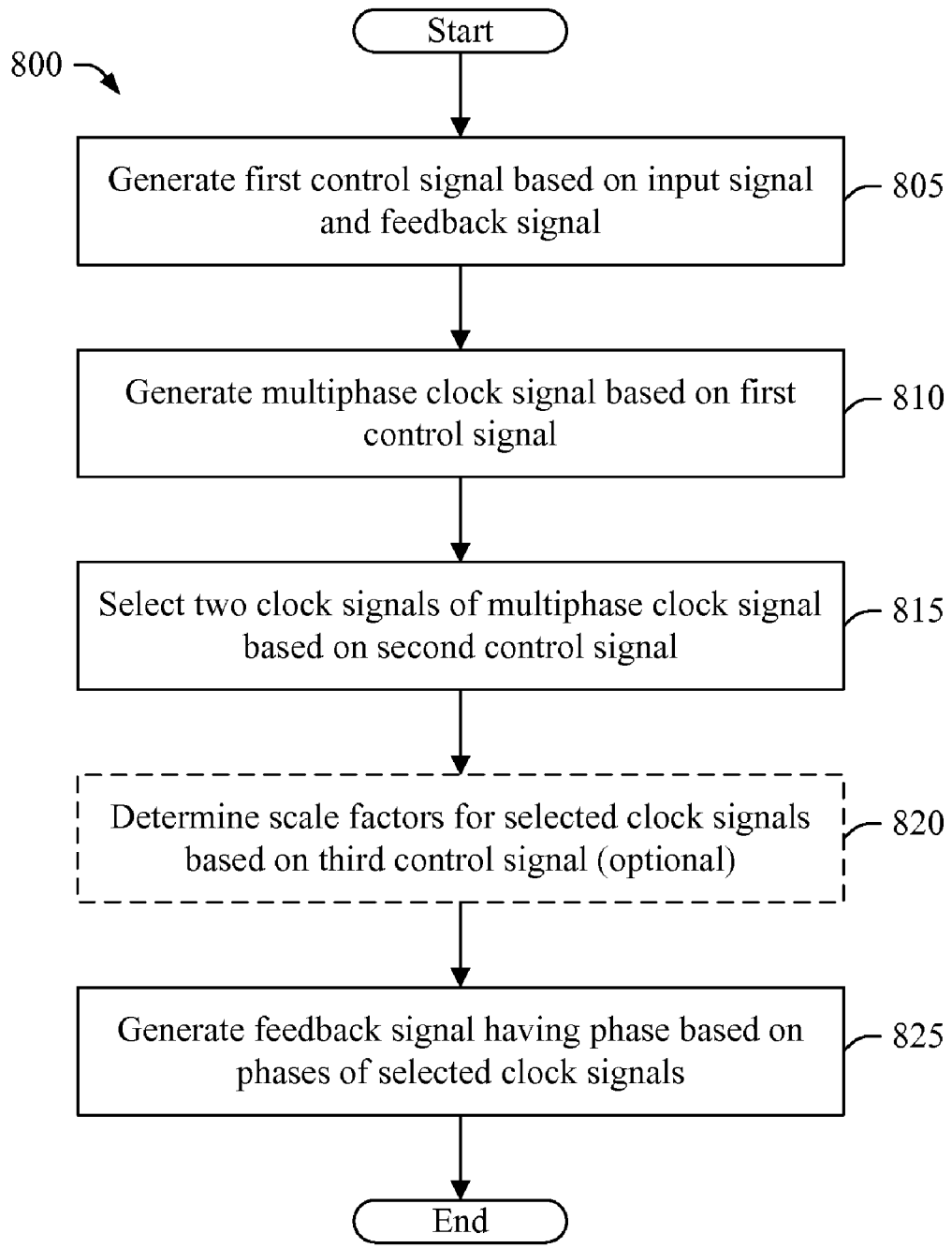
FIG. 8 is a flow chart for a method of generating a multiphase clock signal, in accordance with an embodiment of the present invention.

FIG. 8 illustrates a method 800 of generating the multiphase clock signal 145, in accordance with an embodiment of the present invention. In step 805, the clock generator 100 generates the control signal 135 (e.g., a first control signal) based on the input signal 105 and the feedback signal 155. In one embodiment, the phase detector 110 generates the phase difference signal 115 based on the input signal 105 and the feedback signal 155. Further, the charge pump 120 generates the voltage signal 125 based on the phase difference signal 115, and the low pass filter 130 generates the control signal 135 based on the voltage signal 125. The control signal 135 represents a phase difference between the phase of the input signal 105 and the phase of the feedback signal 155. The method 800 then proceeds to step 810.

In step 810, the voltage controlled oscillator 140 generates the multiphase clock signal 145 based on the control signal 135. Further, the voltage controlled oscillator 140 determines the oscillation frequency of the multiphase clock signal 145 and the oscillation frequency of each clock signal 150 (e.g., clock signals 150a-d) in the multiphase clock signal 145, based on the control signal 135. In this process, the voltage controlled oscillator 140 establishes the phase relationships between each of the clock signals 150 and the input signal 105. The method 800 then proceeds to step 815.

In step 815, the phase shift unit 170 selects clock signals 150 of the multiphase clock signal 145 based on the control signal 175 (e.g., a second control signal). In one embodiment, the phase shift unit 170 selects two clock signals 150 of the multiphase clock signal 145. In other embodiments, the phase shift unit 170 may select more or fewer clock signals 150 of the multiphase clock signal 145. The method 800 then proceeds to step 820.

In optional step 820, the phase shift unit 170 determines a scale factor for one or more of the selected clock signals 150 for positioning the phase of the feedback signal 155 between the phases of the selected clock signals 150. For example, the phase shift unit 170 may determine a scale factor for each of the current sources I1 and I2 in the phase mixer 510 for positioning the phase of the feedback signal 155 between the phases of the selected clock signals 150. The method 800 then proceeds to step 825.

In step 825, the phase shift unit 170 generates the feedback signal 155 based on the phases of the selected clock signal 150. In various embodiments, the phase shift unit 170 generates the feedback signal 155 such that the phase of the feedback signal 155 is between the phases of the selected clock signals 150. For example, the phase shift unit 170 may interpolate the phase of the feedback signal 155 based on the phases of the selected clock signals 150 such that the phase of the feedback signal 155 is between the phases of two of the selected clock signals 150.

In embodiments including the frequency divider 160, phase shift unit 170 generates the phase signal 165 based on the phases of the selected clock signal 150. For example, the phase shift unit 170 may interpolate the phase of the phase signal 165 based on the phases of the selected clock signals 150. Further, the frequency divider 160 generates the feedback signal 155 by dividing the oscillation frequency of the phase signal 165. The method 800 then ends. In an alternative embodiment, the method 800 returns to step 805 after step 825.

In various embodiments, the steps 805-825 of the method 800 are repeated until the clock generator 100 locks the oscillation frequency of the input signal 105 to the oscillation frequency of the feedback signal 155 and locks the phase of the feedback signal 155 to the phase of the input signal 105. In some embodiments, the steps 805-825 may be performed in a different order. In various embodiments, some or all of the steps 805-825 may be performed in parallel. For example, some of all of the steps 805-825 may be performed substantially simultaneously in some embodiments.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A clock generator, comprising:
   a phase detector configured to generate a phase difference signal for aligning a phase of an input signal with a phase of a feedback signal, the phase difference signal representing a phase difference between the phase of the input signal and the phase of the feedback signal;
   a charge pump coupled to the phase detector and configured to generate a voltage signal based on the phase difference signal, the voltage signal having a voltage representing the phase difference between the phase of the input signal and the phase of the feedback signal;
   a low pass filter coupled to the charge pump and configured to generate a first control signal by smoothing the voltage signal;
   a voltage controlled oscillator coupled to the low pass filter and configured to generate a plurality of clock signals having an oscillation frequency based on the first control signal, each clock signal of the plurality of clock signals having a phase, the plurality of clock signals having a substantially constant phase relationship with each other and including at least one in-phase clock signal and at least one quadrature clock signal; and
   a phase shift unit coupled to the voltage controlled oscillator and the phase detector, the phase shift unit configured to select clock signals of the plurality of clock signals and to generate the feedback signal based on the selected clock signals, the phase of the feedback signal between the phases of two of the selected clock signals, the phase shift unit further configured to determine a scale factor for each of the selected clock signals for positioning the phase of the feedback signal between the phases of the selected clock signals.

2. The clock generator of claim 1, wherein each clock signal of the plurality of clock signals comprises differential clock signals.

3. A clock generator, comprising:
   a phase detector configured to generate a phase difference signal for aligning a phase of an input signal with a phase of a feedback signal, the phase difference signal representing a phase difference between the phase of the input signal and the phase of the feedback signal;
   a charge pump coupled to the phase detector and configured to generate a voltage signal based on the phase difference signal, the voltage signal having a voltage representing the phase difference between the phase of the input signal and the phase of the feedback signal;
   a low pass filter coupled to the charge pump and configured to generate a first control signal by smoothing the voltage signal;
   a voltage controlled oscillator coupled to the low pass filter and configured to generate a plurality of clock signals having an oscillation frequency based on the first control signal, each clock signal of the plurality of clock signals having a phase, the plurality of clock signals having a substantially constant phase relationship with each other and including at least one in-phase clock signal and at least one quadrature clock signal; and
   a phase shift unit coupled to the voltage controlled oscillator and the phase detector, the phase shift unit configured to select clock signals of the plurality of clock signals and to generate the feedback signal based on the selected clock signals, the phase shift unit including a phase mixer configured to interpolate the phase of the feedback signal based on the phases of the selected clock signals, wherein the phase shift unit is further configured to select the clock signals of the plurality of clock signals based on a second control signal and wherein the phase mixer is further configured to determine a scale factor for each of the selected clock signals based on a third control signal for positioning the phase of the feedback signal between the phases of the selected clock signals.

4. A clock generator, comprising:
   a phase detector configured to generate a phase difference signal for aligning a phase of an input signal with a phase of a feedback signal, the phase difference signal representing a phase difference between the phase of the input signal and the phase of the feedback signal;

a charge pump coupled to the phase detector and configured to generate a voltage signal based on the phase difference signal, the voltage signal having a voltage representing the phase difference between the phase of the input signal and the phase of the feedback signal;

a low pass filter coupled to the charge pump and configured to generate a first control signal by smoothing the voltage signal;

a voltage controlled oscillator coupled to the low pass filter and configured to generate a plurality of clock signals having an oscillation frequency based on the first control signal, each clock signal of the plurality of clock signals having a phase, the plurality of clock signals having a substantially constant phase relationship with each other and including at least one in-phase clock signal and at least one quadrature clock signal;

a phase shift unit coupled to the voltage controlled oscillator, the phase shift unit configured to select clock signals of the plurality of clock signals and to generate a phase signal based on the selected clock signals, the phase signal having a phase between the phases of two of the selected clock signals, the phase signal further having an oscillation frequency, the phase shift unit further configured to determine a scale factor for each of the selected clock signals for positioning the phase of the feedback signal between the phases of the selected clock signals; and a frequency divider coupled to the phase shift unit and the phase detector, the frequency divider configured to generate the feedback signal by dividing the oscillation frequency of the phase signal.

5. The clock generator of claim 4, wherein each clock signal of the plurality of clock signals comprises differential clock signals.

6. A clock generator, comprising:

a phase detector configured to generate a phase difference signal for aligning a phase of an input signal with a phase of a feedback signal, the phase difference signal representing a phase difference between the phase of the input signal and the phase of the feedback signal;

a charge pump coupled to the phase detector and configured to generate a voltage signal based on the phase difference signal, the voltage signal having a voltage representing the phase difference between the phase of the input signal and the phase of the feedback signal;

a low pass filter coupled to the charge pump and configured to generate a first control signal by smoothing the voltage signal;

a voltage controlled oscillator coupled to the low pass filter and configured to generate a plurality of clock signals having an oscillation frequency based on the first control signal, each clock signal of the plurality of clock signals having a phase, the plurality of clock signals having a substantially constant phase relationship with each other and including at least one in-phase clock signal and at least one quadrature clock signal;

a phase shift unit coupled to the voltage controlled oscillator, the phase shift unit configured to select clock signals of the plurality of clock signals and to generate a phase signal based on the selected clock signals, the phase shift unit including a phase mixer configured to interpolate the phase of the phase signal based on the phases of the selected clock signals, wherein the phase shift unit is further configured to select clock signals of the plurality of clock signals based on a second control signal and wherein the phase mixer is further configured to determine a scale factor for each of the selected clock signals based on a third control signal for positioning the phase of the phase signal between the phases of the selected clock signals; and a frequency divider coupled to the phase shift unit and the phase detector, the frequency divider configured to generate the feedback signal by dividing the oscillation frequency of the phase signal.

7. A method for generating a multiphase clock signal, the method comprising:

generating a first control signal representing a phase difference between a phase of an input signal and a phase of a feedback signal;

generating a plurality of clock signals having an oscillation frequency based on the first control signal, each clock signal of the plurality of clock signals having a phase, the plurality of clock signals having a substantially constant phase relationship with each other and including at least one in-phase clock signal and at least one quadrature clock signal;

selecting clock signals of the plurality of clock signals; and generating the feedback signal based on the selected clock signals, the feedback signal having a phase between the phases of the selected clock signals, wherein generating the feedback signal comprises scaling each of the selected clock signals to position the phase of the feedback signal between the phases of the selected clock signals.

8. The method of claim 7, wherein the clock signal is selected based on a second control signal and wherein each of the selected clock signals is a differential signal.

9. The method of claim 7, wherein generating the first control signal comprises:

generating a phase difference signal representing a phase difference between the phase of the input signal and the phase of the feedback signal;

generating a voltage signal based on the phase difference signal, the voltage signal having a voltage representing the phase difference between the phase of the input signal and the phase of the feedback signal; and smoothing the voltage signal to generate the first control signal.

10. The method of claim 7, wherein generating the feedback signal comprises determining an oscillation frequency of the feedback signal by dividing the oscillation frequency of the selected clock signals.

11. The method of claim 7, wherein generating the feedback signal comprises:

generating a phase signal based on the selected clock signals, the phase signal having a phase between the phases of the selected clock signals; and determining an oscillation frequency of the feedback signal by dividing an oscillation frequency of the phase signal.

12. A system for generating a multiphase clock, the system comprising:

means for generating a first control signal representing a phase difference between a phase of an input signal and a phase of a feedback signal;

means for generating a plurality of clock signals having an oscillation frequency based on the first control signal, each clock signal of the plurality of clock signals having a phase, the plurality of clock signals having a substantially constant phase relationship with each other and including at least one in-phase clock signal and at least one quadrature clock signal;

means for selecting clock signals of the plurality of clock signals; and means for generating the feedback signal based on the selected clock signals, the feedback signal having a phase between the phases of the selected clock signals, wherein generating the feedback signal comprises scaling each of the selected clock signals to position the phase of the feedback signal between the phases of the selected clock signals.

13. The system of claim 12, wherein each clock signal of the plurality of clock signals includes differential clock signals.

* * * * *